(12) United States Patent
Rofougaran et al.

(10) Patent No.: US 9,160,288 B2
(45) Date of Patent: Oct. 13, 2015

(54) METHOD AND SYSTEM FOR SHARING A SINGLE ANTENNA FOR FREQUENCY MODULATION (FM) RECEPTION OR FM TRANSMISSION AND NEAR FIELD COMMUNICATION (NFC)

(75) Inventors: Ahmadreza Rofougaran, Newport Coast, CA (US); Maryam Rofougaran, Rancho Palos Verdes, CA (US)

(73) Assignee: Broadcom Corporation, Irvine, CA (US)

( * ) Notice: Subject to any disclaimer, the term of this patent is extended or adjusted under 35 U.S.C. 154(b) by 460 days.

(21) Appl. No.: 13/558,187

(22) Filed: Jul. 25, 2012

(65) Prior Publication Data

US 2013/0023223 A1    Jan. 24, 2013

Related U.S. Application Data

(63) Continuation of application No. 11/753,708, filed on May 25, 2007, now Pat. No. 8,238,825.

(60) Provisional application No. 60/895,698, filed on Mar. 19, 2007.

(51) Int. Cl.
| | |
|---|---|
| *H04B 5/00* | (2006.01) |
| *H03F 3/21* | (2006.01) |
| *H03F 3/24* | (2006.01) |
| *H03F 3/72* | (2006.01) |
| *H03G 3/30* | (2006.01) |

(52) U.S. Cl.
CPC ............. *H03F 3/211* (2013.01); *H03F 3/245* (2013.01); *H03F 3/72* (2013.01); *H03G 3/3068* (2013.01); *H03G 3/3078* (2013.01); *H03F 2200/129* (2013.01); *H03F 2200/156* (2013.01); *H03F 2200/294* (2013.01); *H03F 2200/451* (2013.01); *H03F 2203/7236* (2013.01)

(58) Field of Classification Search
CPC ........... H03F 3/211; H03F 3/245; H03F 3/72; H03G 3/3078; H03G 3/3068
USPC ......... 340/10.1, 572.1, 5.53; 455/552.1, 41.2, 455/185.1, 102, 82, 78
See application file for complete search history.

(56) References Cited

U.S. PATENT DOCUMENTS

| | | | | |
|---|---|---|---|---|
| 8,238,825 | B2 * | 8/2012 | Rofougaran et al. | 455/41.2 |
| 8,369,889 | B2 * | 2/2013 | Rofougaran et al. | 455/552.1 |
| 2004/0116074 | A1 * | 6/2004 | Fujii et al. | 455/41.2 |
| 2007/0030116 | A1 * | 2/2007 | Feher | 340/5.53 |

* cited by examiner

*Primary Examiner* — Shahriar Behnamian
(74) *Attorney, Agent, or Firm* — Oblon, McClelland, Maier & Neustadt, L.L.P.

(57) ABSTRACT

Aspects of a method and system for sharing a single antenna for frequency modulation (FM) transmission or FM reception, and near field communication (NFC) are presented. Aspects of a system may include at least one circuit that enables, via a single antenna, simultaneous transmission of an FM signal and transmission of an NFC signal or reception of an NFC signal.

20 Claims, 5 Drawing Sheets

METHOD AND SYSTEM FOR SHARING A SINGLE ANTENNA FOR FREQUENCY MODULATION (FM) RECEPTION OR FM TRANSMISSION AND NEAR FIELD COMMUNICATION (NFC)

CROSS-REFERENCE TO RELATED APPLICATIONS/INCORPORATION BY REFERENCE

This application is a Continuation of U.S. application Ser. No. 11/753,708, filed May 25, 2007, now U.S. Pat. No. 8,238,825 which makes reference to, and claims priority to, and claims the benefit of U.S. Provisional Application Ser. No. 60/895,698 filed Mar. 19, 2007, which is hereby incorporated herein by reference in its entirety.

FIELD OF THE INVENTION

Certain embodiments of the invention relate to wireless communication. More specifically, certain embodiments of the invention relate to a method and system for sharing a single antenna for frequency modulation (FM) reception or FM transmission, and near field communication (NFC).

BACKGROUND OF THE INVENTION

As portable electronic devices and wireless devices become more popular, an increasing range of mobility applications and services are emerging. There are well established broadcast and communication services, which utilize the frequency modulation (FM) frequency band. In addition, there are other communication services, which utilize other frequency bands. Near field communication (NFC) is a communication standard that enables wireless communication devices, such as cellular telephones, SmartPhones, and personal digital assistants (PDAs) to establish peer-to-peer (P2P) networks. NFC may enable electronic devices to exchange data and/or initiate applications automatically when they are brought in close proximity, for example ranging from touching, or 0 cm, to a distance of about 20 cm.

NFC may enable downloading of images stored in a digital camera, to a personal computer, or downloading of audio and/or video entertainment to MP3 devices, or downloading of data stored in a SmartPhone to a personal computer, or other wireless device, for example. NFC may be compatible with smart card technologies and may also be utilized to enable purchase of goods and services. RFID applications and NFC applications may utilize a common RF band.

However, integrating the disparate mobility applications and services into a single device may be costly. Some conventional portable electronic device, for example, may utilize separate antennas, hardware, and/or software for the reception, transmission, and/or processing of signals associated with the various mobility applications and services.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A method and system for sharing a single antenna for sharing a single antenna for frequency modulation (FM) reception or FM transmission, and near field communication (NFC), substantially as shown in and/or described in connection with at least one of the figures, as set forth more completely in the claims.

These and other advantages, aspects and novel features of the present invention, as well as details of an illustrated embodiment thereof, will be more fully understood from the following description and drawings.

DETAILED DESCRIPTION OF THE INVENTION

Certain embodiments of the invention may be found in a method and system for sharing a single antenna for frequency modulation (FM) reception or FM transmission, and near field communication (NFC). Various embodiments of the invention comprise a method and system in which an FM receiver (RX) may receive FM signals while an NFC transceiver may simultaneously transmit or receive NFC signals via a single antenna. The received FM signal may be sent to an FM receiver (RX) and the received NFC signal may be sent to the NFC transceiver. In another aspect of these various embodiments of the invention, the single antenna may also be utilized to enable transmission of FM signals while simultaneously enabling the transmission or reception of NFC signals. Various embodiments of the invention may also comprise combinations of FM transceiver, NFC RX and NFC TX circuitry.

Aspects of a system for utilizing an FM antenna for NFC and RFID may comprise configuring an antenna to receive signals in the FM frequency band, or to receive signals in the NFC frequency band. An exemplary FM frequency band utilized in most of the world may comprise a range of frequencies from about 87.5 MHz to about 108 MHz. An exemplary frequency utilized for NFC signals is about 13.5 MHz.

Figure 1:
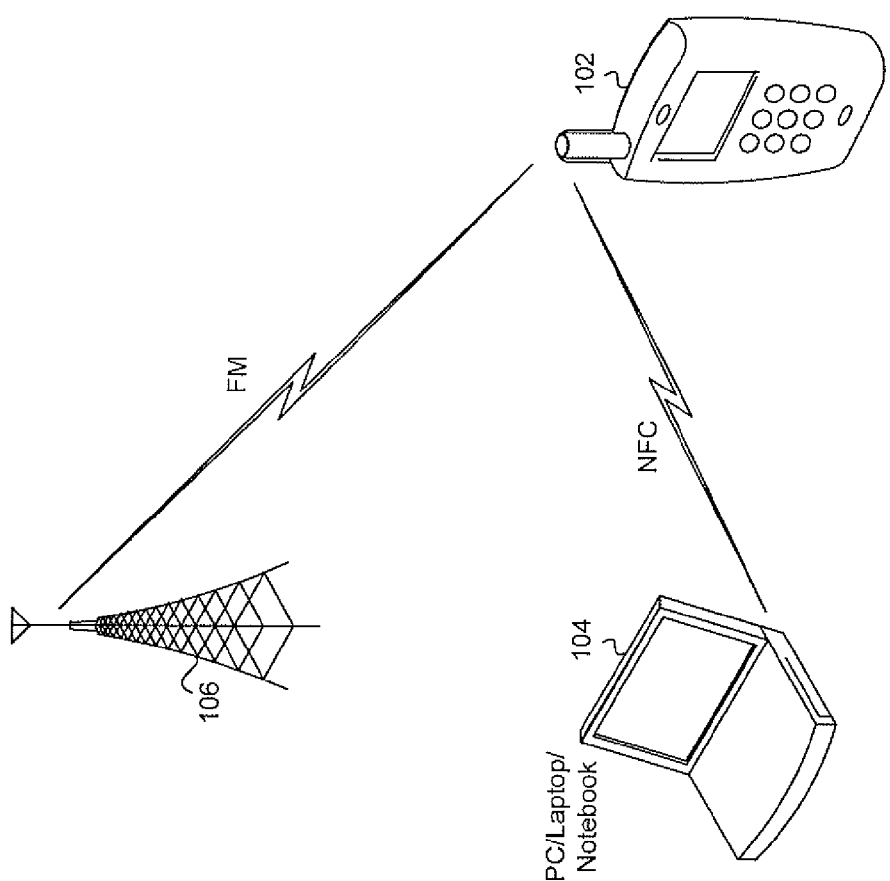
FIG. 1 is a diagram illustrating exemplary FM and NFC communication, which may be utilized in connection with an embodiment of the invention.

FIG. 1 is a diagram illustrating exemplary FM and NFC communication, which may be utilized in connection with an embodiment of the invention. Referring to FIG. 1, there is shown a wireless communication device 102, a personal computer (PC) 104 and an antenna tower 106. In an exemplary embodiment of the invention, the wireless communication device 102 and PC 104 may communicate via signals within the NFC frequency band, while the wireless communication device 102 and antenna tower 106 may communicate via signals within the FM frequency band. Various embodiments of the invention may be practiced in a wide range of wireless communication devices, which may utilize FM and NFC communication via a single antenna. For example, in another exemplary embodiment of the invention, the PC 104 may utilize a single antenna to enable FM and NFC communication.

When a device, such as the wireless communication device 102, attempts to transmit data via signals within the NFC frequency band, it may generate an electromagnetic field within its proximate vicinity. The PC 104 may detect corresponding electromagnetic energy, which may cause initiation of an NFC peer-to-peer (P2P) communication. The wireless communication device 102 may generate a signal based on the data to be transmitted. The signal, when transmitted via an antenna, may cause variations in the electromagnetic field. The PC 104 may detect the variations in the electromagnetic field that may enable the PC 104 to receive the data transmitted by the wireless communication device 102. In various embodiments of the invention, the wireless communication device 102 may similarly receive signals within the NFC frequency band, via the antenna, by detecting variations in the electromagnetic field generated by the PC 104, for example.

In various embodiments of the invention, the wireless communication device 102 may also transmit signals within the FM frequency band. In this regard, the wireless communication device 102 may generate RF signals by modulating data on an FM carrier signal for which the frequency may be represented as $f_{TX}$. The RF signals may be transmitted via the same antenna utilized for transmitting and receiving NFC signals, as described above. The FM signals may be transmitted via the antenna simultaneously with the reception and/or transmission of NFC signals.

The wireless communication device 102 may similarly receive RF signals within the FM frequency band for which the frequency may be represented as $f_{RX}$. The RF signals may be received via the same antenna utilized for transmitting FM frequency band signals. In various embodiments of the invention, the FM signals may be received via the antenna simultaneously with the reception and/or transmission of NFC signals. For frequencies $f_{RX} \neq f_{TX}$, FM signals may be received via the antenna at the frequency $f_{RX}$ simultaneously with the transmission of FM signals via the antenna at the frequency $f_{TX}$.

Figure 2A:
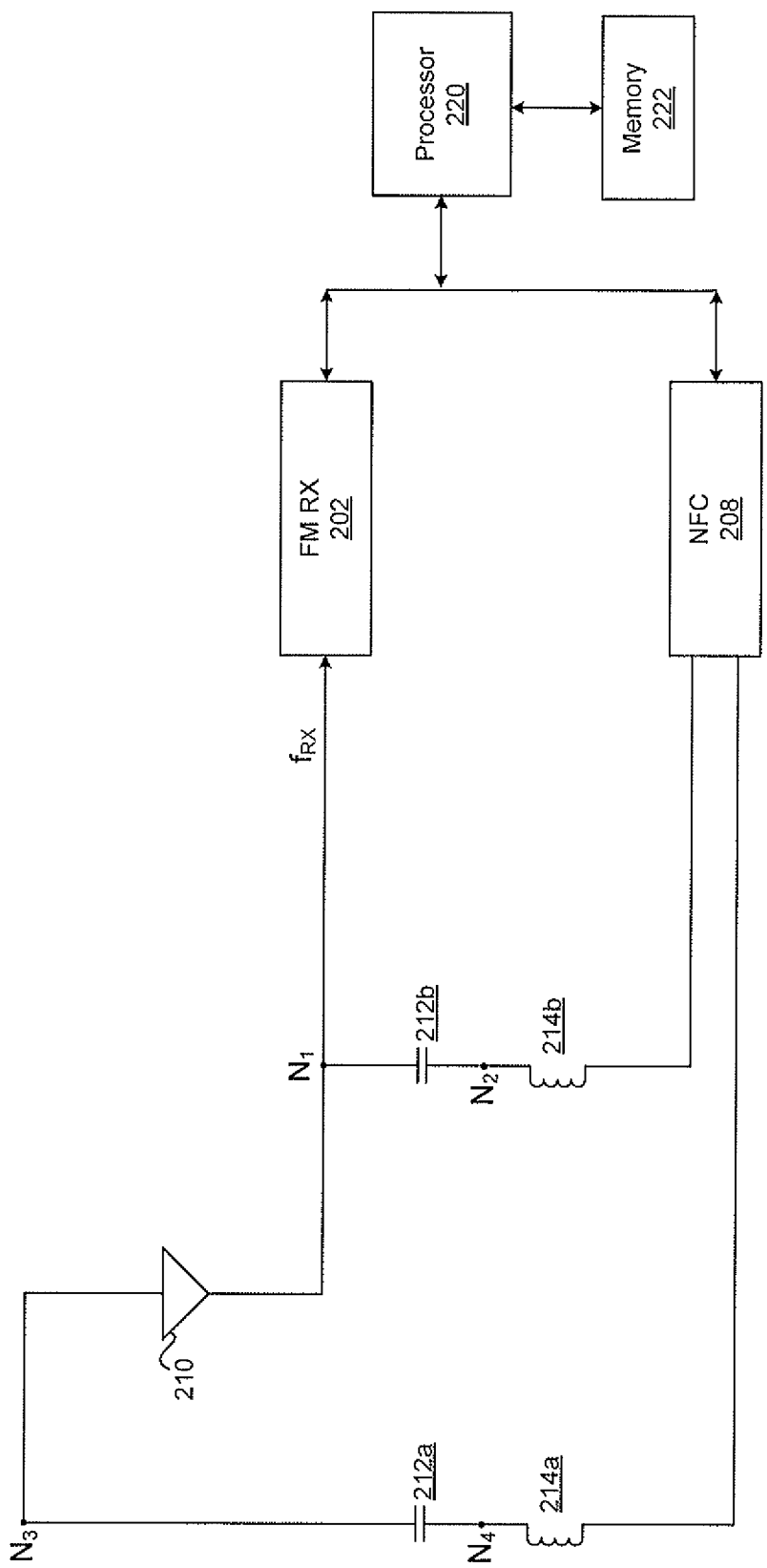
FIG. 2A is a block diagram illustrating an exemplary system for FM reception and near field communication (NFC) with a single antenna, in accordance with an embodiment of the invention.

FIG. 2A is a block diagram illustrating an exemplary system for FM reception and near field communication (NFC) with a single antenna, in accordance with an embodiment of the invention. Referring to FIG. 2, there is shown an FM RX 202, an NFC transceiver 208, a processor 220, an antenna 210, capacitors 212a and 212b and inductors 214a and 214b.

The FM RX 202 may comprise suitable logic, circuitry and/or code that may enable the reception of modulated RF signals, for which the FM frequency band carrier frequency may be $f_{RX}$, and generation of decoded, or raw binary data contained within the received RF signals. The FM RX 202 may perform tasks that include the downconversion of the received RF signal to generate a baseband signal, the demodulation of data symbols contained within the baseband signal, based on a modulation type (for example, eight level phase shift keying (8-PSK)), to derive encoded data bits and decoding of the encoded decoded bits to derive the raw binary data.

The NFC transceiver 208 may comprise suitable logic, circuitry and/or code that may enable the reception of NFC signals, for which the carrier frequency of the received signal may be in the NFC frequency band. Data may be modulated in the received NFC signal. The NFC transceiver 208 may detect the NFC signal by detecting variations in the magnitude and/or direction of an electromagnetic field. The NFC transceiver 208 may perform tasks that include the downconversion of the received NFC signal to generate a baseband signal, the demodulation of data symbols contained within the baseband signal, based on a modulation type, to derive encoded data bits and decoding of the encoded decoded bits to derive the raw binary data.

The NFC transceiver 208 may also comprise suitable logic, circuitry and/or code that may enable the reception of raw binary data and the generation of modulated NFC signals. The NFC transceiver 208 may perform tasks that include the encoding of raw binary data to generate encoded binary data, the modulation of groups of encoded data bits, based on a modulation type, to generate a baseband signal comprising data symbols, and the upconversion of the baseband signal to generate the NFC signal.

The antenna 210 may enable simultaneous reception and/or transmission of NFC and FM signals, In an exemplary embodiment of the invention, the antenna 210 may comprise a serpentine wire.

The capacitor 212a and inductor 214a may form a filter circuit, for example, a bandpass filter. The characteristics of the filter circuit may be such that the impedance may approximate a short circuit when the frequency of a received signal is within the NFC frequency band, and may approximate an open circuit, or high impedance level, when the frequency of the received signal is not within the NFC frequency band. The capacitor 212b and inductor 214b may form a circuit, which is substantially similar to the circuit formed by the capacitor 212a and inductor 214a.

The processor 220 may generate control signals that enable a communication device, such as a wireless communication device 102, to utilize a single antenna to transmit or receive NFC signals while simultaneously transmitting and/or receiving FM signals. The processor 220 may execute code that may enable the generation of data to be transmitted in signals. The processor 220 may also execute code that may enable the processing of data from received signals. The processor 220 may also execute code that enables the selection of modulation types for FM and NFC signal reception. The processor 220 may also enable the selection of carrier frequencies for FM transmission and/or FM reception.

The memory 222 may comprise suitable logic, circuitry, and/or code that may be utilized to store, or write, and/or retrieve, or read, information, data, and/or executable code. The memory 222 may enable storage and/or retrieval of data that may be utilized transmission or reception of NFC signals and for simultaneous reception and/or transmission of FM signals. The memory 222 may comprise a plurality of random access memory (RAM) technologies such as, for example, DRAM, and/or nonvolatile memory, for example electrically erasable programmable read only memory (EEPROM).

In operation, with reference to FIG. 2, the antenna 210 may be coupled to the nodes $N_1$ and $N_3$. The FM RX 202 and one terminal of the capacitor 212b may also be coupled to the node $N_1$. The other terminal of the capacitor 212b and one terminal of the inductor 214b may be coupled to the node $N_2$. The other terminal of the inductor 214b may be coupled to the NFC transceiver 208. One terminal of the capacitor 212a may also be coupled to the node $N_3$. The other terminal of the capacitor 212a and one terminal of the inductor 214a may be coupled to the node $N_4$. The other terminal of the inductor 214a may be coupled to the NFC transceiver 208, When a signal is received via the antenna 210 for which the carrier frequency is within the NFC frequency band, the impedance of the capacitor 212a and inductor 214a circuit may approximate a short circuit. Similarly, the impedance of the capacitor 212b and inductor 214b circuit may also approximate a short circuit. As a result, the NFC signal received via the antenna 210 may be coupled to the NFC transceiver 208. The FM RX 202 may also receive the NFC signal and filter out the NFC signal during signal processing.

When a signal is generated by the NFC transceiver 208 for which the carrier frequency is within the NFC frequency band, the signal may be coupled to the antenna 210, which may enable the transmission of the NFC signal via a wireless communication medium. The FM RX 202 may detect signal energy from the transmitted NFC signal but may filter out the NFC signal during signal processing.

When an FM signal is received via the antenna 210 (for which the carrier frequency, $f_{RX}$, is within the FM frequency range), the FM RX 202 may receive the signal but the impedance of the capacitor 212a and inductor 214a circuit may approximate an open circuit, and the impedance of the capacitor 212b and inductor 214b circuit may also approximate an open circuit. Consequently, the FM RX 202 may receive the received FM signal while the NFC 208 may not receive signal energy from the received FM signal.

Based on the foregoing, in various embodiments of the invention the FM RX 202 may simultaneously receive signals while the NFC transceiver 208 receives or transmits signals.

Figure 2B:
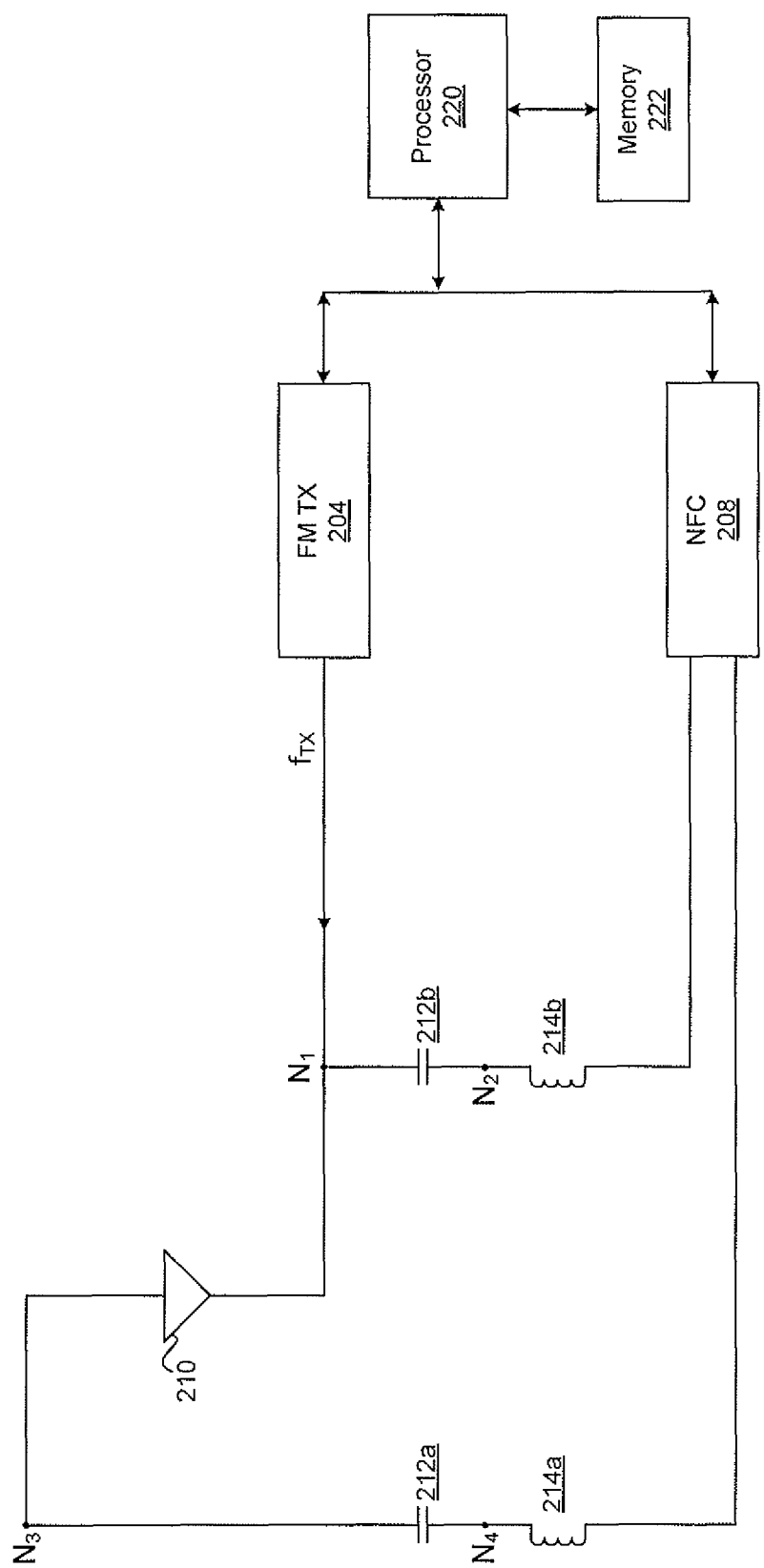
FIG. 2B is a block diagram illustrating an exemplary system for FM transmission and near field communication (NFC) with a single antenna, in accordance with an embodiment of the invention.

FIG. 2B is a block diagram illustrating an exemplary system for FM transmission and near field communication (NFC) with a single antenna, in accordance with an embodiment of the invention. Referring to FIG. 2, there is shown an FM TX 204 an NFC transceiver 208, a processor 220, an antenna 210, capacitors 212a and 212b and inductors 214a and 214b.

The FM TX 204 may comprise suitable logic, circuitry and/or code that may enable the reception of raw binary data and the generation of modulated RF signals, for which the FM frequency band carrier frequency may be $f_{TX}$. The FM TX 204 may perform tasks that include the encoding of raw binary data to generate encoded binary data, the modulation of groups of encoded data bits, based on a modulation type, to generate a baseband signal comprising data symbols, and upconversion of the baseband signal, for which the FM frequency band carrier frequency may be $f_{TX}$, to generate the RF signal.

In operation, with reference to FIG. 2, the antenna 210 may be coupled to the nodes $N_1$ and $N_3$. The FM TX 204 and one end of the capacitor 212b may also be coupled to the node $N_1$. The other end of the capacitor 212b and one end of the inductor 214b may be coupled to the node $N_2$. The other end of the inductor 214b may be coupled to the NFC transceiver 208. One end of the capacitor 212a may also be coupled to the node $N_3$. The other end of the capacitor 212a and one end of the inductor 214a may be coupled to the node $N_4$. The other end of the inductor 214a may be coupled to the NFC transceiver 208.

When a signal is received via the antenna 210 for which the carrier frequency is within the NFC frequency band, the impedance of the capacitor 212a and inductor 214a circuit may approximate a short circuit. Similarly, the impedance of the capacitor 212b and inductor 214b circuit may also approximate a short circuit. As a result, the NFC signal received via the antenna 210 may be coupled to the NFC transceiver 208.

When a signal is generated by the NFC transceiver 208 for which the carrier frequency is within the NFC frequency band, the signal may be coupled to the antenna 210, which may enable the transmission of the NFC signal via a wireless communication medium.

When an FM signal is generated by the FM TX 204 (for which the carrier frequency, $f_{TX}$, is within the FM frequency range), signal energy from the generated FM signal may be transmitted via the antenna 210. The impedance of the capacitor 212a and inductor 214a circuit may approximate an open circuit, and the impedance of the capacitor 212b and inductor 214b circuit may also approximate an open circuit. Consequently, the FM TX 204 may transmit an FM signal via the antenna 210 while the NFC 208 may not receive signal energy from the transmitted FM signal.

Based on the foregoing, in various embodiments of the invention the FM TX 204 may transmit signals while the NFC transceiver 208 receives or transmits signals. In various other embodiments of the invention, the FM RX 202 may receive signals while the NFC transceiver 208 receives or transmits signals.

Figure 3:
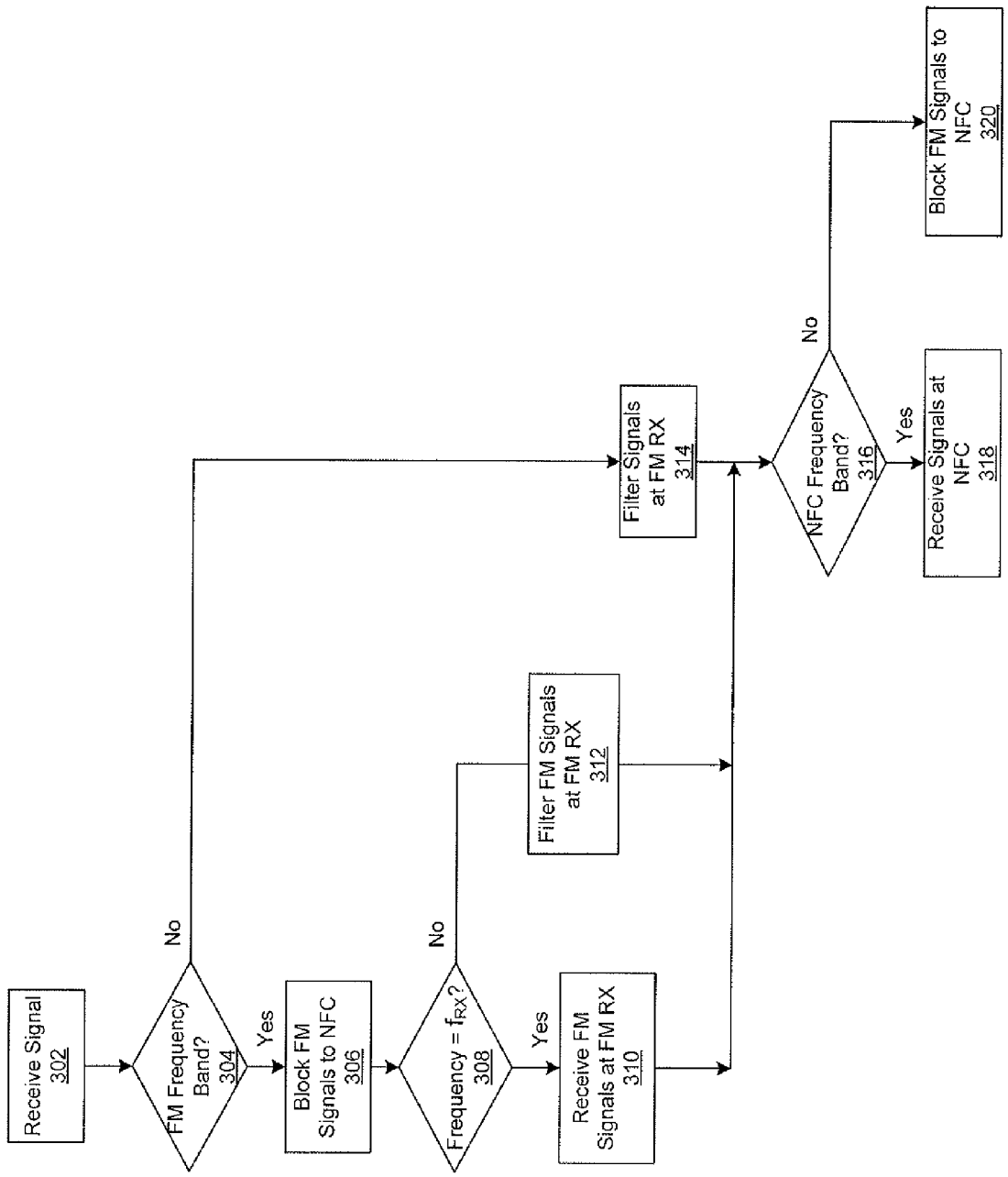
FIG. 3 is a flow chart illustrating exemplary steps for simultaneous reception of FM and NFC signals via a single antenna, in accordance with an embodiment of the invention.

FIG. 3 is a flow chart illustrating exemplary steps for simultaneous reception of FM and NFC signals via a single antenna, in accordance with an embodiment of the invention. Referring to FIG. 3, in step 302, the antenna 210 may receive at least one signal. Step 304 may determine whether the carrier frequency of one of the received signals is within the FM frequency band. If so, in step 306, the NFC transceiver 208 may be blocked from receiving signal energy from the received FM signal. Step 308 may determine whether the frequency of the received signal is $f_{RX}$. If so, in step 310, the FM RX 202 may receive signal energy from the received FM signal. If a determination is made in step 308 that the carrier frequency of the received FM signal is not approximately equal to $f_{RX}$, then in step 312 the FM RX 202 may filter out the received FM signal.

If a determination is made in step 304 that the carrier frequency of the received signal is not within the FM frequency band, then in step 314, the coupler 206 may block the FM RX 202 may filter out the received signal. Step 316 may follow either step 310, 312 or 314.

Step 316 may determine whether the carrier frequency of one of the received signals in step 302 is within the NFC frequency band. If so, the NFC transceiver 208 may receive signal energy from the received NFC signal. If not, the NFC transceiver 208 may be blocked from receiving signal energy from the received signal.

Figure 4:
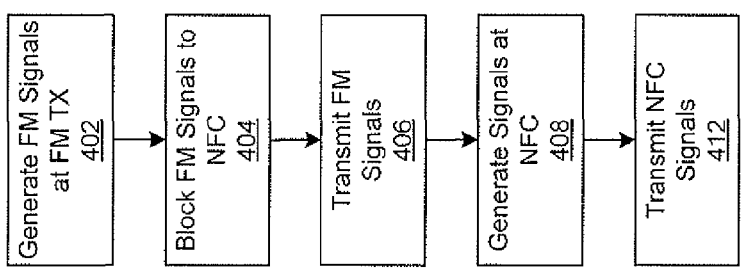
FIG. 4 is a flow chart illustrating exemplary steps for simultaneous transmission of FM and NFC signals via a single antenna, in accordance with an embodiment of the invention.

FIG. 4 is a flow chart illustrating exemplary steps for simultaneous transmission of FM and NFC signals via a single antenna, in accordance with an embodiment of the invention. Referring to FIG. 4, in step 402, the FM TX 204 may generate FM signals. The signal energy from the generated FM signals may be coupled to the node $N_1$. In step 404, the capacitors 212a and 212b and inductors 214a and 214b may block the NFC transceiver 208 from receiving signal energy from the node $N_1$ and/or from the node $N_3$. In step 406, the antenna 210 may transmit the signal detected at the node $N_1$.

In step 408, the NFC transceiver 208 may generate NFC signals. The capacitors 212a and 212b and inductors 214a and 214b may enable signal energy from the generated NFC signal to be coupled to the nodes $N_1$ and $N_3$. In step 412, the antenna 210 may transmit the NFC signal detected at the nodes $N_1$ and $N_3$.

In various embodiments of the invention, the steps 408 and 412 may be performed followed by the steps 402-406, or the steps may be performed simultaneously.

In various embodiments of the invention, an FM TX 204 and NFC transceiver 208 may enable simultaneous transmission of an FM signal, and transmission of an NFC signal or reception of an NFC signal, via a single antenna 210. One or more filter circuits, comprising capacitors 212a and 212b and inductors 214a and 214b may enable blocking of at least a portion of signal energy from the transmitted FM signal from being received by the NFC transceiver 208. The filter circuit(s) may enable transfer of at least a portion of signal energy from the received NFC signal to the NFC transceiver 208. The NFC transceiver 208 may enable generation of an NFC signal. The filter circuit(s) may enable transfer of at least a portion of signal energy from the generated NFC signal to the single antenna 210. The transmitted NFC signal may be generated at the single antenna 210 based on the transferred signal energy from the generated NFC signal. The FM TX 204 may enable generation of an FM signal and transfer of signal energy from the generated FM signal to the single antenna 210. The single antenna 210 may generate the transmitted FM signal based on signal energy from the transferred FM signal.

In various embodiments of the invention, an FM RX 202 and NFC transceiver 208 may enable simultaneous reception of an FM signal, and transmission of an NFC signal or reception of an NFC signal, via a single antenna 210. One or more filter circuits, comprising capacitors 212a and 212b and inductors 214a and 214b may enable blocking of at least a portion of signal energy from the received FM signal from being received by the NFC transceiver 208. The filter circuit(s) may enable transfer of at least a portion of signal energy from the received NFC signal to the NFC transceiver 208. The NFC transceiver 208 may enable generation of an NFC signal. The filter circuit(s) may enable transfer of at least a portion of signal energy from the generated NFC signal to the single antenna 210. The transmitted NFC signal may be generated at the single antenna 210 based on the transferred signal energy from the generated NFC signal. The FM RX 202 may enable filtering of the transmitted NFC signal or the received NFC signal. The FM RX 202 may receive the FM signal received at the single antenna 210.

Another embodiment of the invention may provide a machine-readable storage, having stored thereon, a computer program having at least one code section executable by a machine, thereby causing the machine to perform the steps as described herein for sharing a single antenna for frequency modulation (FM) transmission or FM reception, and near field communication (NFC).

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is the claimed is:

1. A method for simultaneously receiving a plurality of signals via a single antenna, said method comprising:
    simultaneously receiving said plurality of signals via said single antenna;
    blocking first portions of said plurality of signals received, at frequencies outside of a frequency modulation (FM) band including signals in an FM frequency range, via a first signal path from said single antenna;
    blocking second portions of said plurality of signals received, at frequencies outside of a near field communication (NFC) band including signals in an NFC frequency range, via a second signal path from said single antenna, said second signal path being different than said first signal path;
    receiving a first signal of said plurality of signals at an FM circuit via said first signal path, said first signal being of a frequency within said FM-band; and
    receiving a second signal of said plurality of signals at an NFC circuit via said second signal path, said second signal being of a frequency within said NFC-band.

2. The method according to claim 1, further comprising:
    determining, by a processing circuit, whether a carrier frequency of at least one of said plurality of signals is within said NFC-band; and
    determining, by said processing circuit, whether a carrier frequency of said at least one of said plurality of signals is within said FM-band.

3. The method according to claim 1, further comprising:
    filtering, by said FM circuit, said first signal.

4. The method according to claim 1, wherein said blocking first portions of said plurality of signals received includes blocking, via said first signal path, signal energy of said plurality of signals that are outside of said FM-band.

5. The method according to claim 1, wherein said blocking second portions of said plurality of signals received includes blocking, via said second signal path, signal energy of said plurality of signals that are outside of said NFC-band.

6. The method according to claim 1, wherein
    said first signal path includes a capacitor and an inductor, and
    said first portions of said plurality of signals are blocked via said first signal path by an impedance of said capacitor and said inductor approximating a short circuit.

7. The method according to claim 1, wherein
    said second signal path includes a capacitor and an inductor, and
    said second portions of said plurality of signals are blocked via said second signal path by an impedance of said capacitor and said inductor approximating a short circuit.

8. An apparatus comprising:
    an antenna that simultaneously receives a plurality of signals; and
    processing circuitry that
        blocks first portions of said plurality of signals received, at frequencies outside of a frequency modulation (FM) band including signals in an FM frequency range, via a first signal path from said single antenna; and
        blocks second portions of said plurality of signals received, at frequencies outside of a near field communication (NFC) band including signals in an NFC frequency range, via a second signal path from said single antenna, said second signal path being different than said first signal path;

an FM circuit that receives a first signal of said plurality of signals via said first signal path, said first signal being of a frequency within said FM-band; and an NFC circuit that receives a second signal of said plurality of signals via said second signal path, said second signal being of a frequency within said NFC-band.

9. The apparatus according to claim 8, wherein said processing circuitry determines whether a carrier frequency of at least one of said plurality of signals is within said NFC-band, and determines whether a carrier frequency of said at least one of said plurality of signals is within said FM-band.

10. The apparatus according to claim 8, wherein said FM circuit filters said first signal.

11. The apparatus according to claim 8, wherein said blocking first portions of said plurality of signals received includes blocking, via said first signal path, signal energy of said plurality of signals that are outside of said FM-band.

12. The apparatus according to claim 8, wherein said blocking second portions of said plurality of signals received includes blocking, via said second signal path, signal energy of said plurality of signals that are outside of said NFC-band.

13. The apparatus according to claim 8, further comprising:

a capacitor and an inductor located in said first signal path, wherein said first portions of said plurality of signals are blocked via said first signal path by an impedance of said capacitor and said inductor approximating a short circuit.

14. The apparatus according to claim 8, further comprising:

a capacitor and an inductor located in said second signal path, wherein said second portions of said plurality of signals are blocked via said second signal path by an impedance of said capacitor and said inductor approximating a short circuit.

15. A non-transitory computer readable medium storing computer readable instructions that, when executed by an apparatus including a signal antenna and a processing circuit, cause the apparatus to:

simultaneously receive said plurality of signals via said single antenna;

block first portions of said plurality of signals received, at frequencies outside of a frequency modulation (FM) band including signals in an FM frequency range, via a first signal path from said single antenna;

block second portions of said plurality of signals received, at frequencies outside of a near field communication (NFC) band including signals in an NFC frequency range, via a second signal path from said single antenna, said second signal path being different than said first signal path;

receive a first signal of said plurality of signals at an FM circuit of said apparatus via said first signal path, said first signal being of a frequency within said FM-band; and receive a second signal of said plurality of signals at an NFC circuit of said apparatus via said second signal path, said second signal being of a frequency within said NFC-band.

16. The non-transitory computer readable medium according to claim 15, wherein the apparatus is further caused to:

determine, by said processing circuit, whether a carrier frequency of at least one of said plurality of signals is within said NFC-band; and determine, by said processing circuit, whether a carrier frequency of said at least one of said plurality of signals is within said FM-band.

17. The non-transitory computer readable medium according to claim 15, wherein the apparatus is further caused to:

filter, by said FM circuit, said first signal.

18. The non-transitory computer readable medium according to claim 15, wherein said blocking first portions of said plurality of signals received includes blocking, via said first signal path, signal energy of said plurality of signals that are outside of said FM-band.

19. The non-transitory computer readable medium according to claim 15, wherein said blocking second portions of said plurality of signals received includes blocking, via said second signal path, signal energy of said plurality of signals that are outside of said NFC-band.

20. The non-transitory computer readable medium according to claim 15, wherein said first signal path includes a capacitor and an inductor, and said first portions of said plurality of signals are blocked via said first signal path by an impedance of said capacitor and said inductor approximating a short circuit.

* * * * *